US005544013A

United States Patent [19]
Chiou

[11] Patent Number: 5,544,013
[45] Date of Patent: Aug. 6, 1996

[54] CPU RADIATING FLANGE MOUNTING DEVICE

[76] Inventor: Ming D. Chiou, 3F., No. 4, Alley 11, Lane 327, Sec. 2, Chung Shan Rd., Chung Ho City Taipei, Taiwan

[21] Appl. No.: 304,896

[22] Filed: Sep. 13, 1994

[51] Int. Cl.$^6$ .................................................. H05K 7/20
[52] U.S. Cl. ........................... 361/687; 24/625; 248/510; 257/719; 361/697; 361/704
[58] Field of Search ................................. 248/316.7, 505, 248/510; 411/352, 904; 24/472, 625, 626, 328, 329, 489, 517, 518, 533; 62/259.2; 165/80.3, 122, 126; 174/16.3; 257/706, 707, 713, 718, 719, 727; 267/150, 160, 687–690, 694, 695, 697, 703, 717, 718, 704

[56] References Cited

U.S. PATENT DOCUMENTS

| | | | |
|---|---|---|---|
| 4,716,494 | 12/1987 | Bright | 361/704 |
| 5,208,731 | 5/1993 | Blomquist | 361/386 |
| 5,251,101 | 10/1993 | Liu | 361/717 |
| 5,307,239 | 4/1994 | McCarty | 361/704 |
| 5,309,983 | 5/1994 | Bailey | 165/80.3 |
| 5,349,823 | 9/1994 | Solomon | 62/6 |
| 5,377,745 | 1/1995 | Hsieh | 165/80.3 |
| 5,386,338 | 1/1995 | Jordan | 361/704 |
| 5,409,352 | 4/1995 | Lin | 415/177 |

*Primary Examiner*—Gerald P. Tolin
*Attorney, Agent, or Firm*—Pro-Techtor International

[57] ABSTRACT

A CPU radiating flange mounting device including two hangers respectively made from a springy wire rod and pivotably connected to two opposite sides of a radiating flange for hanging on projecting rods on two opposite sides of a CPU holder to secure the radiating flange to the CPU holder above a CPU, which is mounted within the CPU holder.

1 Claim, 4 Drawing Sheets

CPU RADIATING FLANGE MOUNTING DEVICE

BACKGROUND OF THE INVENTION

The present invention relates to a CPU radiating flange mounting device for fastening a radiating flange to a zero insertion force CPU holder.

Regular CPU radiating flanges are commonly made or equipped with hooks for mounting. As shown in FIG. 4, the radiating flange is fastened to the CPU holder to hold down the CPU by hooking the hooks of the radiating flange on the bottom wall of the CPU holder. Because of the arrangement of the hooks, a space (more than 1 mm height) is left between the CPU holder and the circuit board. This space affect the connection between the CPU and the circuit board and the connection between the CPU holder and the circuit board. When this CPU radiating flange mounting device is used to fasten a radiating flange to the CPU of a vertical computer, the CPU holder may fall from the circuit board easily.

SUMMARY OF THE INVENTION

The present invention has been accomplished to provide a CPU radiating flange mounting device which eliminates the aforesaid problems. A CPU radiating flange mounting device according to the present invention comprises two hangers respectively made from springy wire rods and pivotably connected to two opposite sides of a radiating flange for fastening the radiating flange to a CPU holder by hanging, to hold down a CPU within the CPU holder. Each hanger has two opposite hooked ends turnably hooked in respective hook holes on the radiating flange, two curved wire rod sections bridged over one side of the radiating flange, and a hanging rod section spaced between the curved wire rod sections and detachably hung on the projecting rods on one side of the radiating flange.

DETAILED DESCRIPTION OF THE PREFERRED EMBODIMENT

Figure 1:
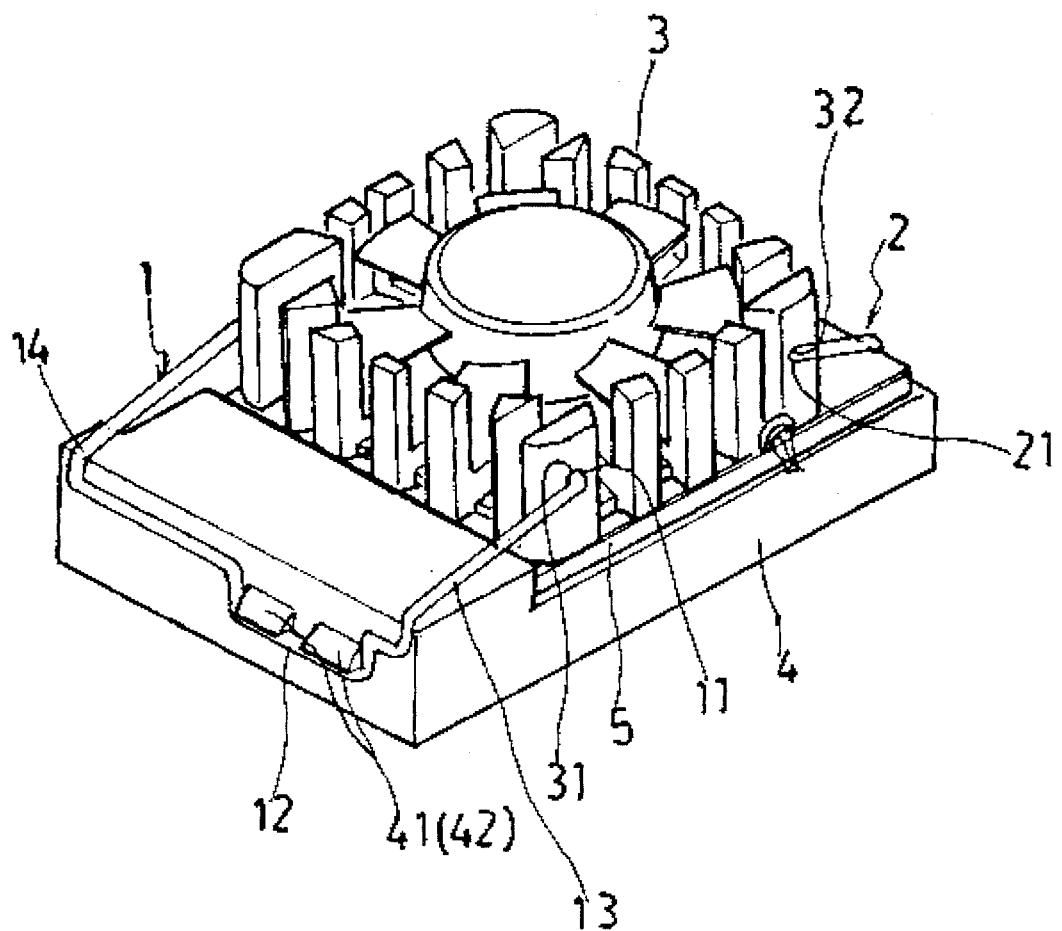
FIG. 1 is an elevational of a CPU radiating flange mounting device according to the present invention.
Figure 2:
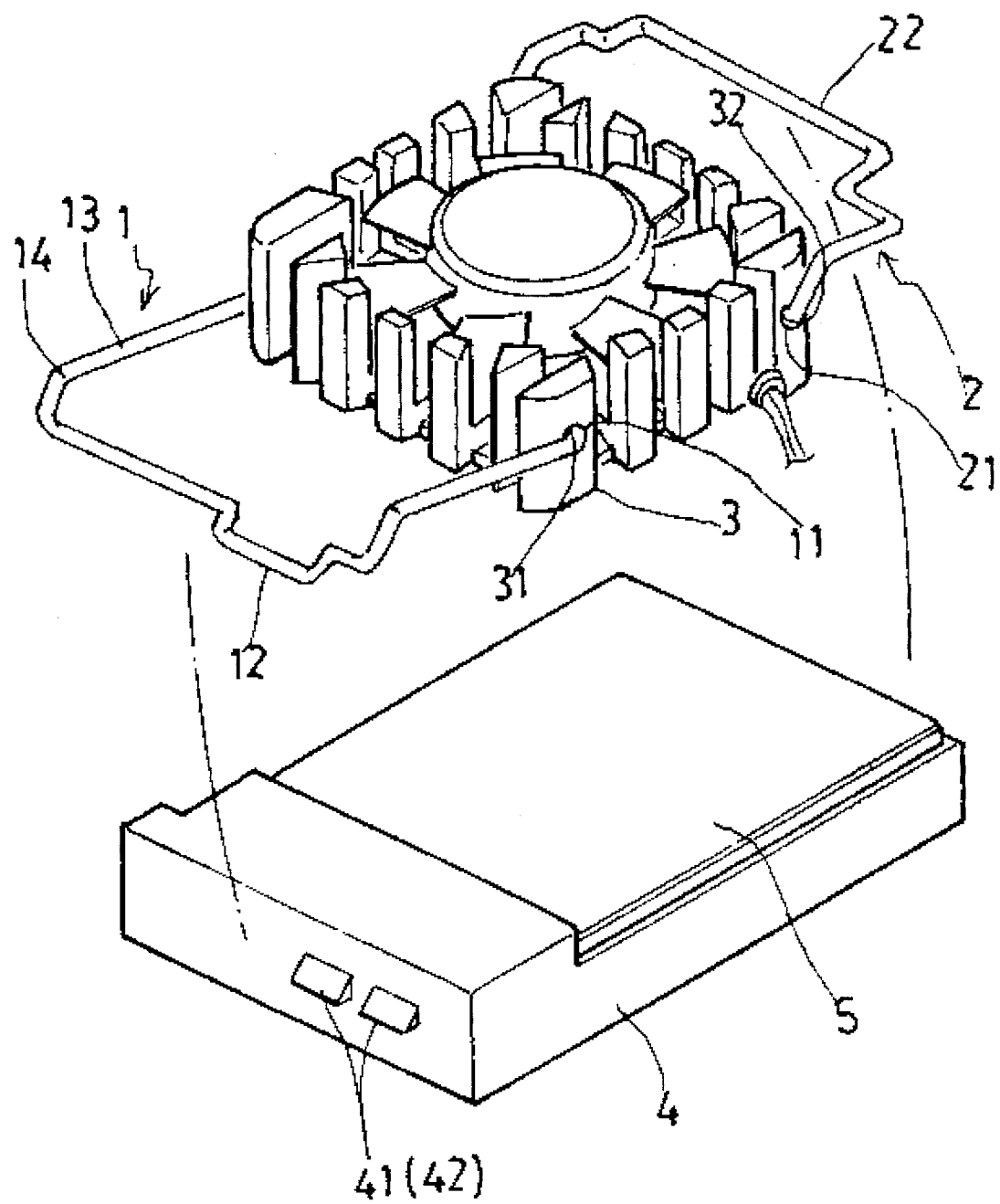
FIG. 2 is an exploded view of the CPU radiating flange mounting device shown in FIG. 1.

Referring to FIGS. 1 and 2, a CPU radiating frame mounting device is generally comprised of a first hanger 1 and a second hanger 2 pivotably connected to two opposite sides of a CPU radiating flange 3 for fastening the CPU radiating flange 3 to a zero insertion force CPU holder 4 to hold down a CPU 5 on the CPU holder 4. The hanger 1 or 2 is made from a springy wire of substantially U-shaped configuration, having two opposite hooked ends 11 or 21 respectively turnably hooked in two opposite hook holes 31 on the radiating flange 3, two curved wire rod sections 14 bilaterally disposed in the middle, and a hanging wire rod section 12 spaced between the curved wire rod sections 14 for hanging on projecting rods 41 or 42 on the holder 4.

Figure 3:
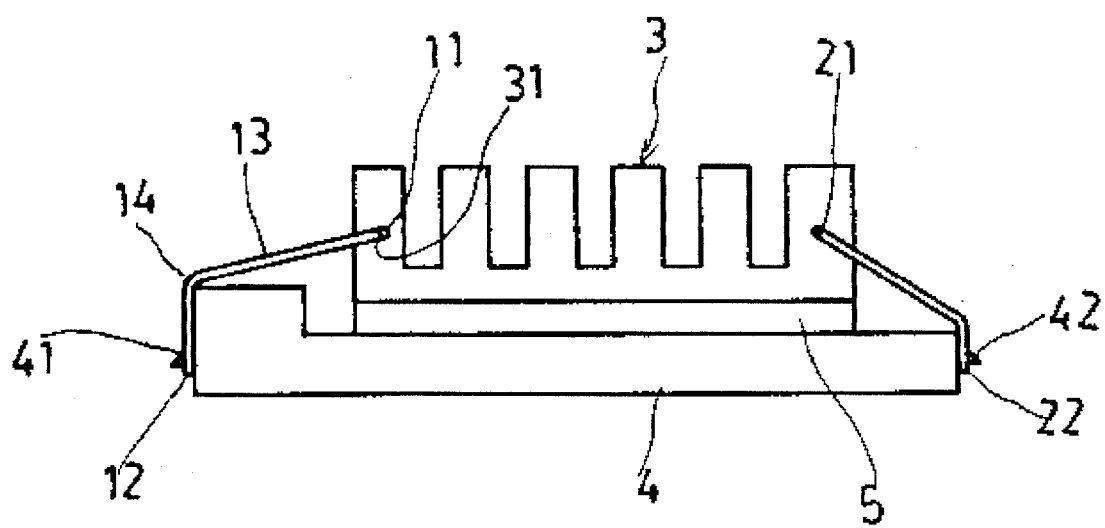
FIG. 3 is a side view of the CPU radiating flange mounting device shown in FIG. 1.
Figure 4:
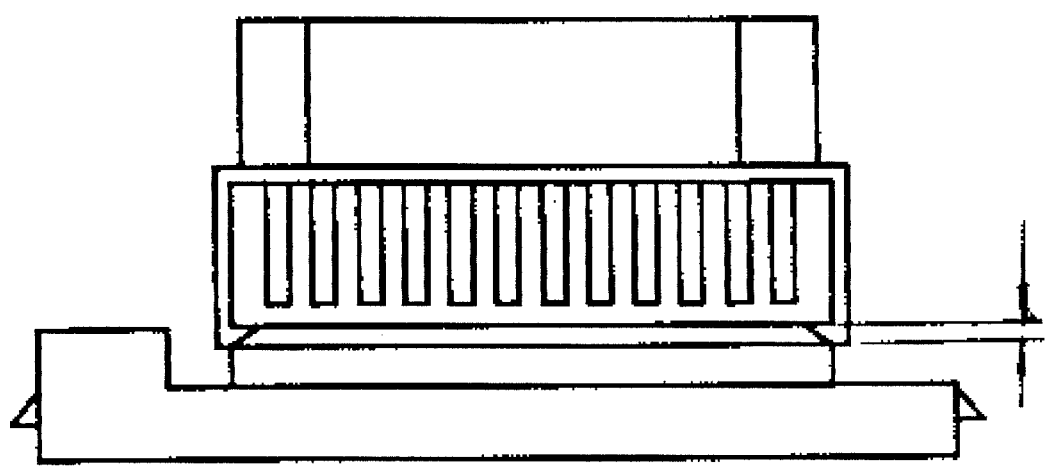
FIG. 4 is a sectional view of a CPU radiating flange mounting device according to the prior art.

Referring to FIG. 3, after the CPU 5 is mounted on the CPU holder 4 at the top, the radiating flange 3 is mounted on the CPU 5 at the top and then fixed in place to hold down the CPU 5 in position by bridging the curved wire rod sections 14 of the first and second hangers 1 and 2 over two opposite sides of the CPU holder 4 and hanging the hanging wire rod sections 12 and 22 on the projecting rods 41 and 42 on the CPU holder 4. After installation, the radiating flange 3 can be conveniently removed from the CPU holder 4 by pulling the hanging wire rod sections 12 and 22 outwards and then upwards from the projecting rods 41 and 42 of the CPU holder 4.

What is claimed is:

1. A CPU radiating flange mounting device comprising a CPU holder to hold a CPU, said CPU holder having a plurality of projecting rods on two opposite sides thereof, a radiating flange mounted on said CPU holder to hold down said CPU, and two hanger means pivotably connected to opposite sides of said radiating flange and detachably hanging on said projecting rods to secure said radiating flange to said CPU holder, wherein said hanger means are respectively made from a springy wire rod, each having two opposite hooked ends turnably hooked in respective hook holes on said radiating flange, curved rod sections bilaterally disposed in the middle and bridged over one end of said CPU holder, and a hanging rod section spaced between the curved rod sections and respectively hung on said projecting rods of said CPU holder.

\* \* \* \* \*